(12) United States Patent
Li et al.

(10) Patent No.: US 11,545,570 B2
(45) Date of Patent: Jan. 3, 2023

(54) HIGH-VOLTAGE DEVICES INTEGRATED ON SEMICONDUCTOR-ON-INSULATOR SUBSTRATE

(71) Applicant: GLOBALFOUNDRIES Singapore Pte. Ltd., Singapore (SG)

(72) Inventors: Pinghui Li, Singapore (SG); Handoko Linewih, Singapore (SG); Darin Arthur Chan, Santa Clara, CA (US); Ruchil Kumar Jain, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 52 days.

(21) Appl. No.: 16/736,818

(22) Filed: Jan. 8, 2020

(65) Prior Publication Data
US 2021/0210630 A1 Jul. 8, 2021

(51) Int. Cl.
*H01L 29/78* (2006.01)
*H01L 29/66* (2006.01)

(52) U.S. Cl.
CPC .... *H01L 29/7824* (2013.01); *H01L 29/66681* (2013.01)

(58) Field of Classification Search
CPC ........... H01L 29/7824; H01L 29/66681; H01L 29/7816; H01L 29/402; H01L 29/404; H01L 29/405; H01L 29/407
See application file for complete search history.

(56) References Cited

U.S. PATENT DOCUMENTS

| 9,691,787 | B2 | 6/2017 | Zang et al. |
| 9,786,755 | B2 | 10/2017 | Golanski et al. |
| 10,211,336 | B2 | 2/2019 | Zhu et al. |
| 10,283,622 | B1 | 5/2019 | Zhang |
| 2010/0035390 | A1 | 2/2010 | Ding et al. |
| 2013/0020632 | A1* | 1/2013 | Disney ............... H01L 29/0847 257/E21.409 |
| 2014/0339636 | A1* | 11/2014 | Hsu ...................... H01L 27/088 257/343 |
| 2016/0211367 | A1* | 7/2016 | Ito ....................... H01L 29/0886 |

(Continued)

OTHER PUBLICATIONS

Antoine Litty et al., Dual Ground Plane EDMOS in Ultrathin FDSOI for 5V Energy Management Applications, 2014, 134-137, IEEE, New Jersey, US.

(Continued)

*Primary Examiner* — Mohammed R Alam
(74) *Attorney, Agent, or Firm* — David Cain

(57) ABSTRACT

The present disclosure generally to semiconductor devices, and more particularly to semiconductor devices having high-voltage transistors integrated on a semiconductor-on-insulator substrate and methods of forming the same. The present disclosure provides a semiconductor device including a semiconductor-on-insulator (SOI) substrate having a semiconductor layer, a bulk substrate and an insulating layer between the semiconductor layer and the bulk substrate, a source region and a drain region disposed on the bulk substrate, an isolation structure extending through the insulating layer and the semiconductor layer and terminates in the bulk substrate, and a gate structure between the source region and the drain region, the gate structure is disposed on the semiconductor layer.

20 Claims, 12 Drawing Sheets

(56) References Cited

U.S. PATENT DOCUMENTS

2018/0240737 A1\* 8/2018 Tu .................... H01L 23/535
2018/0366579 A1\* 12/2018 Yan .................... H01L 27/04
2019/0386134 A1\* 12/2019 Kim .................. H01L 29/1045

OTHER PUBLICATIONS

Antoine Litty et al., EDMOS in Ultrathin FDSOI: Effect of Doping and Layout of the Drift Region, 2015, 134-137, IEEE, New Jersey, US.

O. Bon et al., First 15V complementary LDMOS transistors in thin SOI 65nm low power technology, 2007, 209-212, IEEE, New Jersey, US.

\* cited by examiner

HIGH-VOLTAGE DEVICES INTEGRATED ON SEMICONDUCTOR-ON-INSULATOR SUBSTRATE

FIELD OF THE INVENTION

The disclosed subject matter relates generally to semiconductor devices, and more particularly to semiconductor devices having high-voltage transistors integrated on a semiconductor-on-insulator substrate and methods of forming the same.

BACKGROUND

Integrated circuit (IC) chip integration requires the formation of many different types of semiconductor devices on the same chip to enable various features offered by the integrated semiconductor devices. Many such IC chips employ semiconductor devices for power applications that are subjected to high voltages as well as high-performance semiconductor devices that employ typical low supply voltages. For example, a high voltage power amplifier/switch may be employed in an IC chip to provide a high voltage output. Likewise, a high voltage rectifier in an IC chip may enable a low voltage power supply network from a high voltage power supply connected to the IC chip.

Semiconductor-on-insulator (SOI) substrates, such as fully depleted SOI (FDSOI), or partially depleted SOI (PDSOI) are used for various IC applications. SOI substrates may include a layer of semiconductor material located above a bulk substrate. The thin layer of semiconductor material may be separated from the bulk substrate by a buried oxide (BOX) layer. Typically, IC applications, such as radio frequency or non-volatile memory applications, may include high voltage (HV) transistors, such as extended drain metal oxide semiconductor (EDMOS) transistors, or laterally diffused metal oxide semiconductor (LDMOS) transistors. However, the layer of semiconductor material in SOI substrates is not amenable to accommodate HV transistors. This results in difficulties in integrating HV transistors on SOI substrates. For example, conventional techniques for integrated HV transistors on SOI substrates require complex processing which may incur higher cost. Furthermore, it is found that HV devices built using conventional techniques are unable to sustain high voltage operations (e.g., a higher likelihood of an eventual breakdown of the transistors).

With the industry's drive for higher density, higher performance, higher power, lower-cost devices and the implementation of nanometer-scale process nodes, there is a need to provide semiconductor devices that can overcome, or at least ameliorate, one or more of the disadvantages as described above.

SUMMARY

In an aspect of the present disclosure, there is provided a semiconductor device including a semiconductor-on-insulator (SOI) substrate having a semiconductor layer, a bulk substrate and an insulating layer between the semiconductor layer and the bulk substrate, a source region and a drain region disposed on the bulk substrate, an isolation structure extending through the insulating layer and the semiconductor layer and terminates in the bulk substrate, and a gate structure between the source region and the drain region, the gate structure is disposed on the semiconductor layer.

In another aspect of the present disclosure, there is provided a method of forming a semiconductor device by providing a semiconductor-on-insulator (SOI) substrate having a semiconductor layer, a bulk substrate and an insulating layer disposed between the semiconductor layer and the bulk substrate, patterning the insulating layer and the semiconductor layer to expose the bulk substrate and retain portions of the insulating layer and the semiconductor layer above the bulk substrate, forming an isolation structure extending through the retained portions of the insulating layer and the semiconductor layer and terminating in the bulk substrate, forming a gate structure on the retained portion of the semiconductor layer, and forming a source region and a drain region on the exposed bulk substrate, the gate structure being formed between the source region and the drain region.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
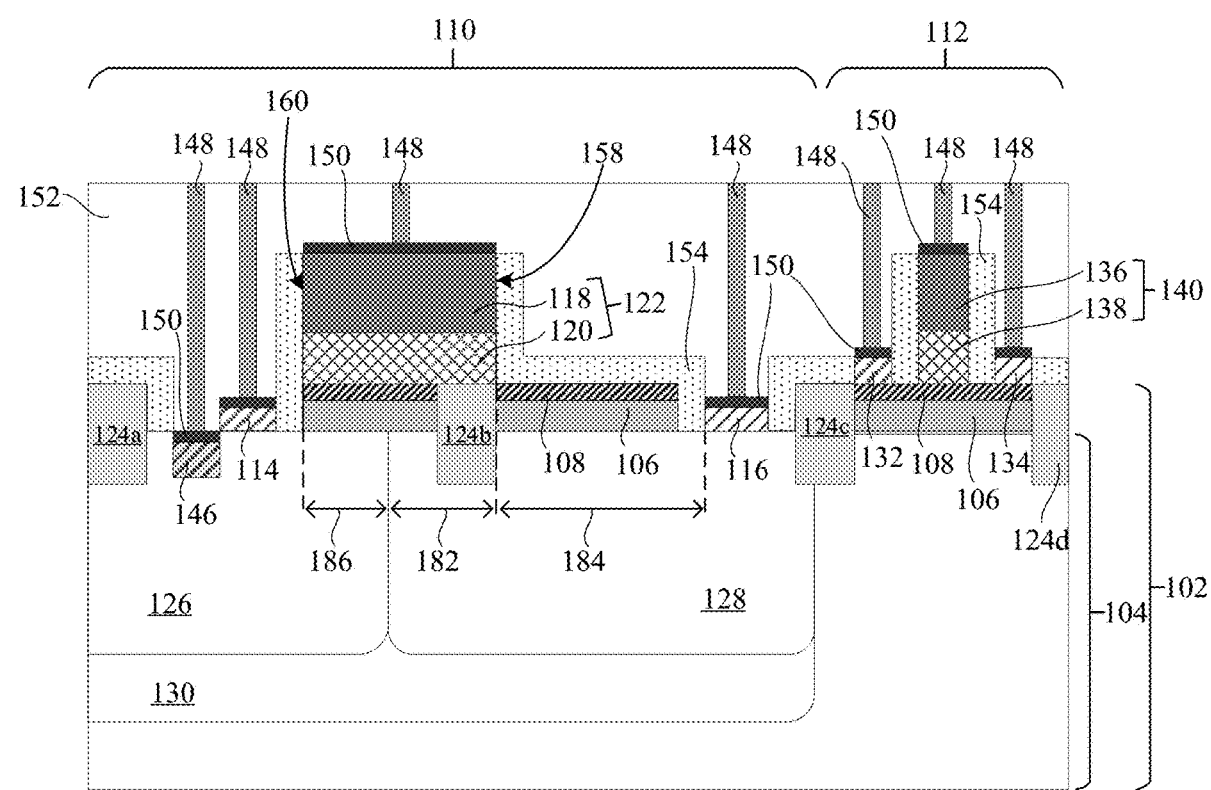
FIGS. 1A-1C are cross-sectional views of exemplary semiconductor devices in accordance with embodiments of the present disclosure.

Referring to FIG. 1A, a cross-sectional view of an exemplary semiconductor device is shown. The device may include a semiconductor-on-insulator (SOI) substrate 102. The SOI substrate 102 may include a semiconductor layer 108, a bulk substrate 104 and an insulating layer 106. The insulating layer 106 is between the semiconductor layer 108 and the bulk substrate 104.

The semiconductor layer 108 and the bulk substrate 104 may be made of any semiconductor material, such as silicon, germanium, silicon germanium (SiGe), silicon carbide, and those consisting essentially of III-V compound semiconductors, such as GaAs, II-VI compound semiconductors such as ZnSe. The semiconductor layer 108 and the bulk substrate 104 may be amorphous, polycrystalline, or monocrystalline.

The semiconductor layer 108 may be a fully depleted or partially depleted semiconductor layer 108. The insulating layer 106 may function as an electrical isolation layer between the semiconductor layer 108 and the bulk substrate 104. In some embodiments, the insulating layer 106 may include an oxide material and may be formed by oxidation of a semiconductor material.

As shown in FIG. 1A, the semiconductor device may include a first device region 110 and a second device region 112. The first device region 110 and second device region 112 may be bounded by isolation structures 124a, 124c, 124d.

The first device region 110 may include a first source region 114 and a first drain region 116 disposed on the bulk substrate 104. In some embodiments, the first source region 114 and first drain region 116 may be raised above a top surface of the bulk substrate 104. Additionally, a first gate structure 122 may be disposed between the first source region 114 and first drain region 116 and on the semiconductor layer 108. The first gate structure 122 may include a first gate electrode 118 and a first gate stack 120. In the embodiment shown in FIG. 1A, the first gate electrode 118 is disposed on the first gate stack 120, and the first gate stack 120 is disposed on the semiconductor layer 108.

The bulk substrate 104 in the first device region 110 and the bulk substrate 104 in the second device region 112 may have doped regions. The doped regions and wells may have different dopant conductivity types, such as P-type and N-type as well as different depths and different dopant concentrations. Exemplary dopants for N-type conductivity doping may include, but not limited to, arsenic, phosphorus, or antimony. Exemplary dopants for P-type conductivity doping may include, but not limited to, boron, aluminum, or gallium. The dopant concentrations, for example, may depend on the technology node and design requirements.

In an embodiment, the bulk substrate 104 in the first device region 110 may have a body well 126 and an adjacent drift well 128. The drift well 128 couples the first drain region 116 with the first gate structure 122. The first drain region 116 may be disposed on a top surface of the drift well 128 and the first source region 114 may be disposed on a top surface of the body well 126. The body well 126 may adjoin the drift well 128, or alternatively, the body well 126 may be spaced apart from the drift well 128. In the embodiment shown in FIG. 1A, an edge of the body well 126 adjoins an edge of the drift well 128 at a location below the first gate structure 122. A deep isolation well 130 may be disposed below the body well 126 and the drift well 128. As shown in FIG. 1A, the first gate structure 122 may partially overlap both the drift well 128 and the body well 126.

The drift well 128 may include an overlap region 182 and a drift extension region 184. The overlap region 182 and the drift extension region 184 may serve to provide an electrical pathway for the diffusion of charges between the first drain region 116 and the first gate structure 122. The drain extension region 184 may function as an extension from the first drain region 116 and is located between the first drain region 116 and the first gate structure 122. The size of the drift extension region 184 may correspond to a distance between an edge of the first drain region 116 and a drain-facing sidewall 158 of the first gate structure 122, and may vary depending on the design requirements of the device. As shown in FIG. 1A, the insulating layer 106 and the semiconductor layer 108 extend laterally to cover the drain extension region 184.

The overlap region 182 of the drift well 128 overlaps with the first gate structure 122 by being located below the first gate structure 122. The size of the overlap region 182 may correspond to a distance between the drain-facing sidewall 158 of the first gate structure 122 and the edge of the drift well 128. The size of the overlap region 182 may also vary depending on the design requirements of the device.

The body well 126 couples the first source region 114 and a body region 146 to the first gate structure 122. The body well 126 may include a channel region 186 to provide an electrical pathway for the diffusion of charges between the first gate structure 122 and the first source region 114 and the body region 146. In some embodiments, the channel region 186 of the body well 126 overlaps with the first gate structure 122 by being located below the first gate structure 122. The size of the channel region 186 may correspond to a distance between a source-facing sidewall 160 of the first gate structure 122 and an edge of the body well 126. The size of the channel region 186 may vary depending on the design requirement of the device.

As used herein, the term "drain-facing" sidewall refers to a sidewall of the first gate structure 122 that faces the first drain region 116. Likewise, the term "source-facing" sidewall refers to a sidewall of the first gate structure 122 that faces the first source region 114.

The body well 126 and the drift well 128 may have opposite conductivity types with respect to each other. For example, the body well 126 is of P-type conductivity, whereas the drift well 128 is of N-type conductivity or vice versa. In an embodiment, the drift well 128 has the same conductivity type as that of the first drain region 116 and the first source region 114.

The body region 146 may be disposed on the bulk substrate 104. In some embodiments, the presence of the deep isolation well 130 is not required if the body region 146 is disposed on the bulk substrate 104. In the embodiment shown in FIG. 1A, the body region 146 may be formed by doping a top surface of the body well 126. The body region 146 may be coupled to a bias voltage for biasing devices in the first device region 110. The body region 146 may have a higher doping concentration and a conductivity type identical to that of the body well 126. In particular, the body region 146 may have a dopant concentration that is higher than the dopant concentration of the body well 126.

A plurality of isolation structures 124a, 124b, 124c, 124d may be formed in the bulk substrate 104. In the embodiment shown in FIG. 1A, one of the isolation structures 124b may be located below the first gate structure 122 in the first device region 110. The isolation structure 124b may extend through the semiconductor layer 108 and the insulating layer 106 and then terminate in the bulk substrate 104. The plurality of isolation structures 124a, 124b, 124c, 124d may be made of a dielectric material, e.g., oxides such as silicon dioxide ($SiO_2$), tetraethyl orthosilicate (TEOS). The isolation structures 124a, 124b, 124c, 124d may be a shallow trench isolation region as shown in FIG. 1A, but alternatively a deep trench isolation region could be used.

As shown in FIG. 1A, one of the isolation structures 124b terminates in the drift well 128 of the bulk substrate 104 of the first device region 110. In some embodiments, the isolation structure 124b may have a top surface that is completely covered by the first gate structure 122. Additionally, the top surface of the isolation structure 124b may be coplanar with a top surface of the semiconductor layer 108.

In some embodiments, the deep isolation well 130 may be sufficiently deep to isolate the body well 126 and the drift well 128 from other doped regions in the bulk substrate 104. The dopant concentration of the deep isolation well may vary depending on the design requirements of the device.

The second device region 112 may include a second source region 132, a second drain region 134, and a second gate structure 140 disposed on the semiconductor layer 108. The second gate structure 140 is between the second source region 132 and the second drain region 134. The semiconductor layer 108 in the second device region 112 may function as active regions in a semiconductor device, e.g., a region for current flow, and may be doped. The second gate structure 140 may include a second gate electrode 136 and a second gate stack 138. As shown in FIG. 1A, the second gate electrode 136 may be disposed on the second gate stack 138, and the second gate stack 138 may be disposed on the semiconductor layer 108.

Interconnect structures may be formed above the various gate and diffusion regions. For example, silicide layers 150 may be formed on top surfaces of each of the first 122 and second 140 gate structures, the first source 114 and drain 116 regions, the second source 132 and drain 134 regions, and the body region 146. Interconnect contacts 148 may be disposed on the silicide layers 150 to provide electrical connections with other IC components (not shown). The interconnect contacts 148 may be embedded in an interlayer dielectric 152.

The first device region 110 utilizes the body well 126 and the drift well 128 in the bulk substrate 104 as the electrical pathways between the first source region 114 and the first drain region 116. The insulating layer 106 in the first device region 110 may function as a gate dielectric layer for the first gate structure 122 to control an electrical characteristic in the bulk substrate 104. In particular, the first gate structure 122 modulates the conductance of the electrical pathway between the first source region 114 and the first drain region 116. Additionally, the presence of the drain extension region 182 and the isolation structure 124b in the bulk substrate 104 of the first device region 110 may serve to reduce the electric field at the PN junction between the body well 126 and the drift well 128. The drain extension region 182 may function as a Reduced Surface Field (RESURF) that increases the capability of the device to sustain high voltage operations.

As for the second device region 112, the semiconductor layer 108 functions as the electrical pathway between the second source region 132 and the second drain region 134. The conductance of the semiconductor layer 108 in the second device region 112 may be modulated by the second gate structure 140. In some implementations, the first device region 110 may provide transistors for high-voltage applications (e.g., operations that require voltages that are larger than 5V, in particular, larger than 10V), whereas the second device region 112 may provide transistors for high-performance applications.

The use of the bulk substrate 104 as the electrical pathway may enable a higher voltage operation as compared to the use of the semiconductor layer 108 as the electrical pathway. For example, the bulk substrate 104 has a larger thickness as compared to that of the semiconductor layer 108, which avoids an eventual breakdown of transistors (i.e., an uncontrollable increase in the current flow) due to a large drain-to-source voltage applied during device operation. Additionally, the larger thickness of the bulk substrate 104 may allow the designing of various device configurations for high-voltage applications, such as the presence of an isolation structure 124b below the first gate structure 122 to reinforce a reduced electric field at the critical region between a depletion region of the body well 126 and the drift well 128.

Figure 1B:
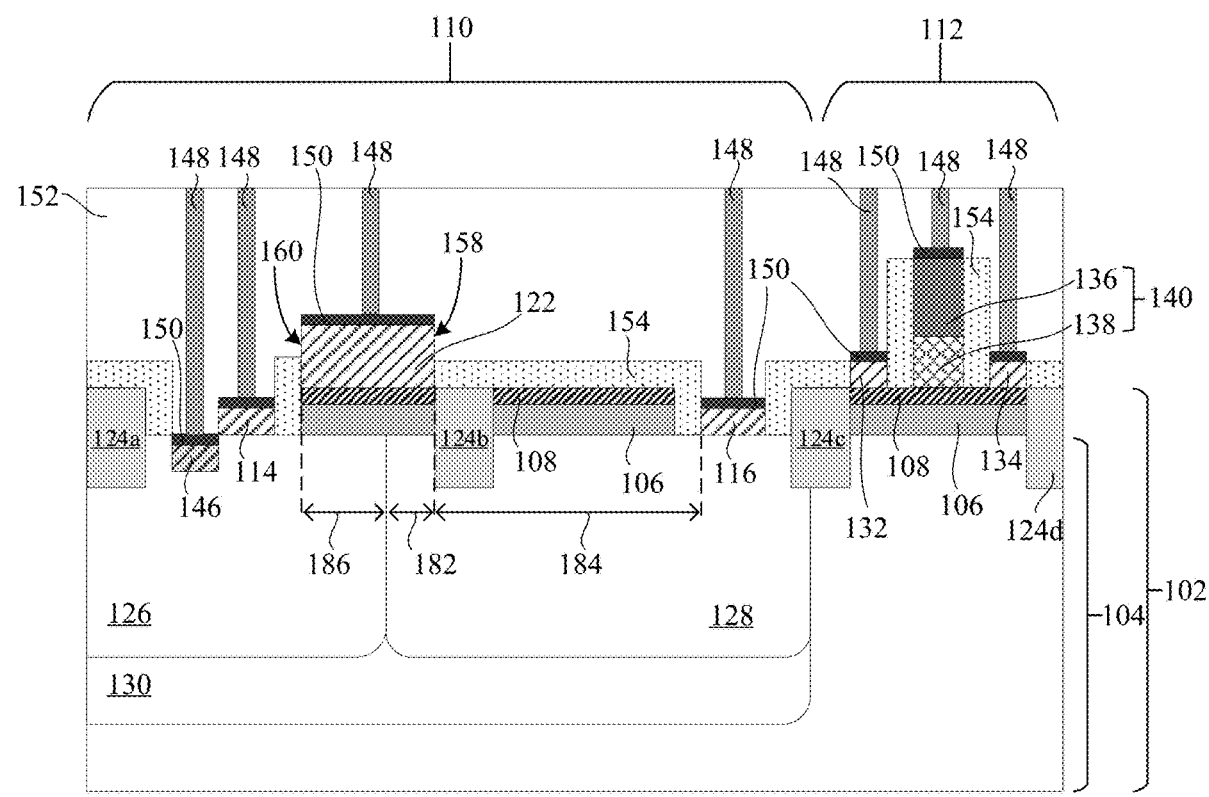

Referring to FIG. 1B, a cross-sectional view of another exemplary semiconductor device is shown. The embodiment shown in FIG. 1B is similar to the embodiment shown in FIG. 1A except that in FIG. 1B, the first gate structure 122 in the first device region 110 has an epitaxial body and may be doped. The epitaxial body of the first gate structure 122 may be formed by growing epitaxial material on top of the semiconductor layer 108. One of the isolation structures 124b may be located below the epitaxial body of the first gate structure 122 with the drain-facing sidewall 158 being aligned with an edge of the isolation structure 124b below. In some embodiments, the epitaxial body of the first gate structure 122 may be of the same material as the semiconductor layer 108 in the first device region 110.

Figure 1C:
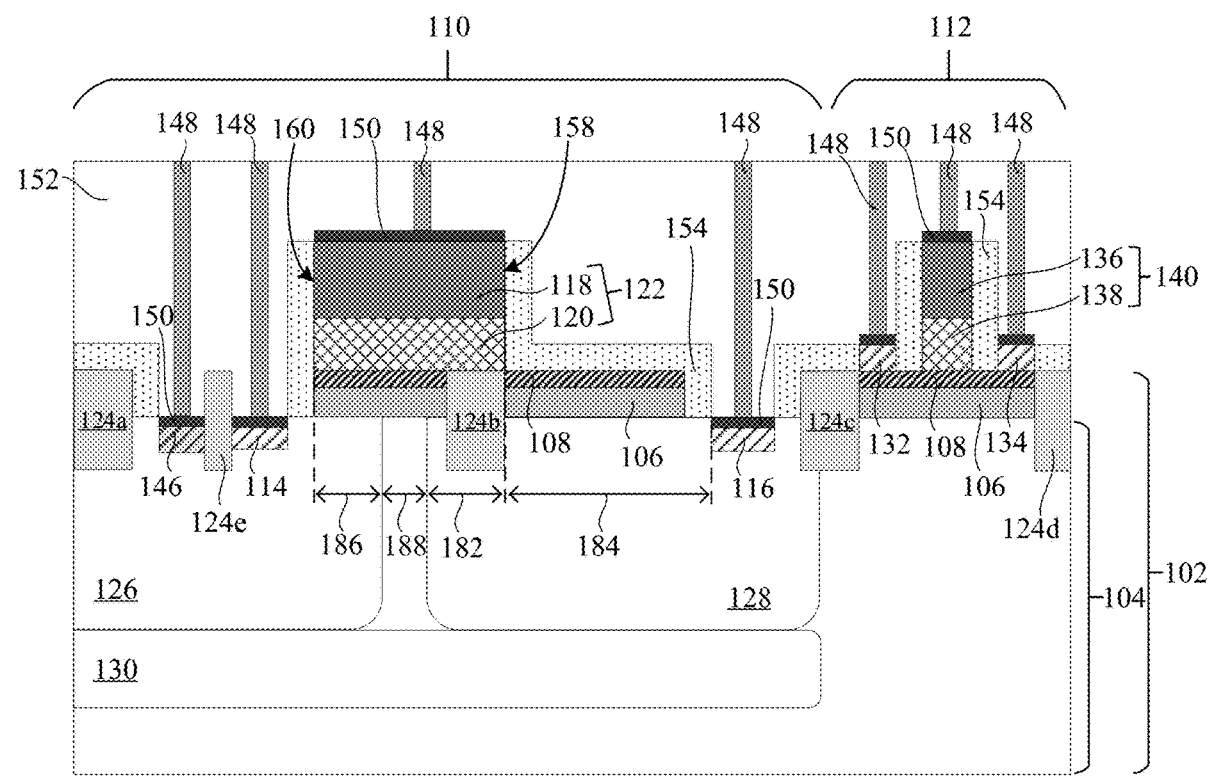

Referring to FIG. 1C, a cross-sectional view of another exemplary semiconductor device is shown. The embodiment shown in FIG. 1C is similar to the embodiment shown in FIG. 1A except that in FIG. 1C, the body well 126 is spaced apart from the drift well 128 by a gap spacing 188 in the bulk substrate 104. The gap spacing 188 in the bulk substrate 104 may be bounded by the edges of the adjacent body well 126 and drift well 128 and the underlying deep isolation well 130, and may be doped so that it is substantially free of extrinsic doping atoms but may still contain charge carriers provided by other doped portions of the structure. The gap spacing 188 between the body well 126 and the drift well 128 may serve to widen the depletion region of the PN junction between the body well 126 and the drift well 128 and reduces the surface electric field stress below the insulating layer 106, thereby lowering the electrical field.

Additionally, FIG. 1C illustrates an implementation where the first source 114 and drain 116 regions in the first device region 110 are formed within a top surface of the body well 126 and the drift well 128 in the bulk substrate 104. FIG. 1C also illustrates an implementation where the first source region 114 and the body region 146 are separated by an isolation structure 124e. It should be understood that the above-mentioned implementations of FIG. 1C are contemplated as being applicable to all embodiments of the present disclosure.

Although FIGS. 1A-1C show a first and second device regions, it is understood that the semiconductor device of the present disclosure may include other device regions in addition to the first and second device regions, such as a memory device region, a field-effect transistor device region, etc.

Additionally, although not shown in the accompanying drawings, embodiments without the presence of a drain extension region 184 are also considered to be within the scope of the present disclosure. For example, embodiments shown in FIGS. 1A-1C may be implemented without a drain extension region 184 in the drift well 128, and the overlap region 182 provides the electrical pathway between the first drain region 116 and the first gate structure 122.

Figure 2:
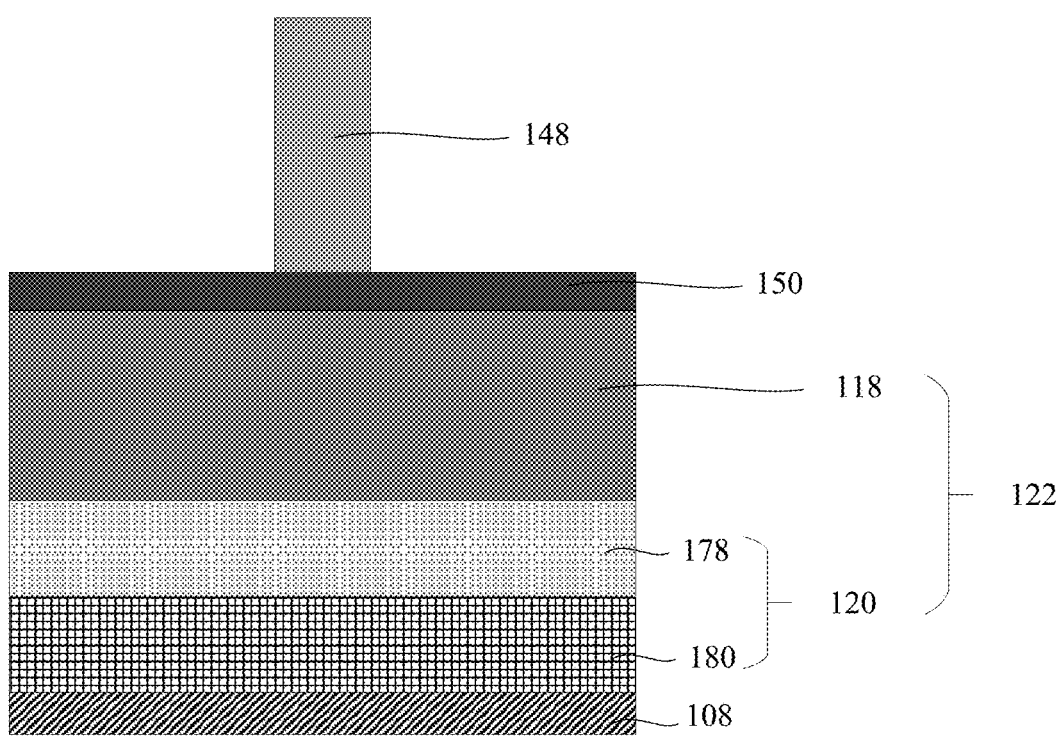
FIG. 2 is an enlarged cross-sectional view depicting components of an exemplary gate structure, in accordance with embodiments of the present disclosure.

Referring to FIG. 2, an enlarged cross-sectional view of an exemplary gate structure is shown. The illustration in FIG. 2 is applicable to any gate structure described herein. As shown, the gate structure 122 may include a gate electrode 118 disposed on a gate stack 120. The gate stack 120 may include several layers. For example, the gate stack 120 may include a work-function material (WFM) layer 178 and a high-k dielectric layer 180. Although not shown in the accompanying drawings, the gate stack may include more than one WFM layers depending on design requirements.

The high-k dielectric layer 180 may be formed on the semiconductor layer 108. The WFM layer 178 may be formed on the high-k dielectric layer 180. The gate electrode 118 may be formed on the WFM layer 178. As shown, the silicide layer 150 may be formed on the gate electrode 118, and the interconnect contact 148 may be formed on the silicide layer 150.

The high-k dielectric layer 180 may include a high-K dielectric material. The term "high-K" as used herein refers to a material having a dielectric constant (i.e., K value) that is greater than 5, preferably between 25 to 30. The high-K dielectric material may include, but not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$).

The gate electrode 118 is made of an electrically conductive material such as, but not limited to, highly doped polysilicon, tungsten, cobalt, nickel, copper, and aluminum. The WFM layer 178 may include any metallic compound or a composition of metallic compounds capable of modifying the work function property of a gate. Examples of metallic compounds may include, but not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof.

FIGS. 3 through 10 show a set of steps that could be used to create the above structure, as provided for in an embodiment of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure or opening. Examples of techniques for patterning include, but not limited to, wet etch lithographic processes, dry etch lithographic processes or direct patterning processes. Such techniques may use mask sets and mask layers.

The term "epitaxial growth" as used herein refers to the growth of a semiconductor material on a deposition surface of a same or different semiconductor material, in which the grown semiconductor material will have the same crystalline characteristics as the deposition surface of the semiconductor material.

Figure 3:
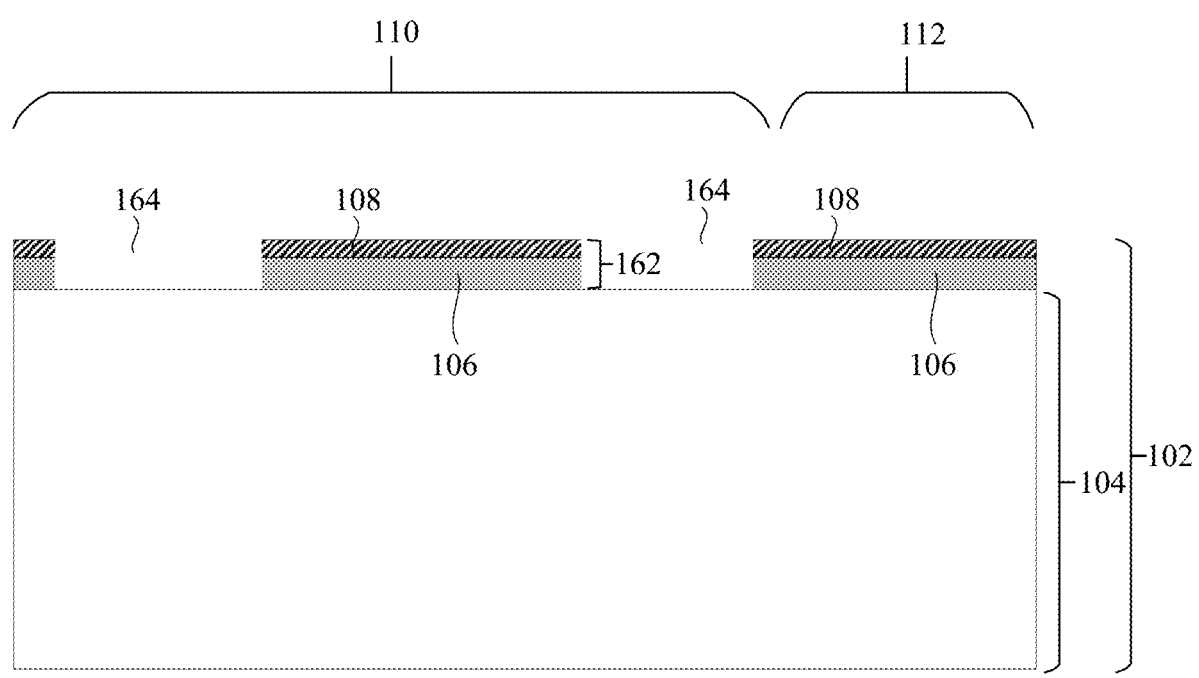
FIG. 3 is a cross-sectional view depicting the patterning of a semiconductor layer and an insulating layer above a bulk substrate, in accordance with embodiments of the present disclosure.

FIG. 3 illustrates the patterning of the insulating layer 106 and the semiconductor layer 108. As shown, an SOI substrate 102 is provided and patterned. The patterning of the insulating layer 106 and the semiconductor layer 108 exposes the underlying bulk substrate 104 and retains portions 162 of the insulating layer 106 and the semiconductor layer 108 above the bulk substrate 104 in the first device region 110. In an embodiment, the patterning step removes portions of the insulating layer 106 and the semiconductor layer 108 to form openings 164 that expose the bulk substrate 104. In subsequent processing steps, source or drain regions are formed on the exposed areas of the bulk substrate 104 through the openings 164. The patterning of the insulating layer 106 and the semiconductor layer 108 may be performed using patterning techniques described herein.

Figure 4:
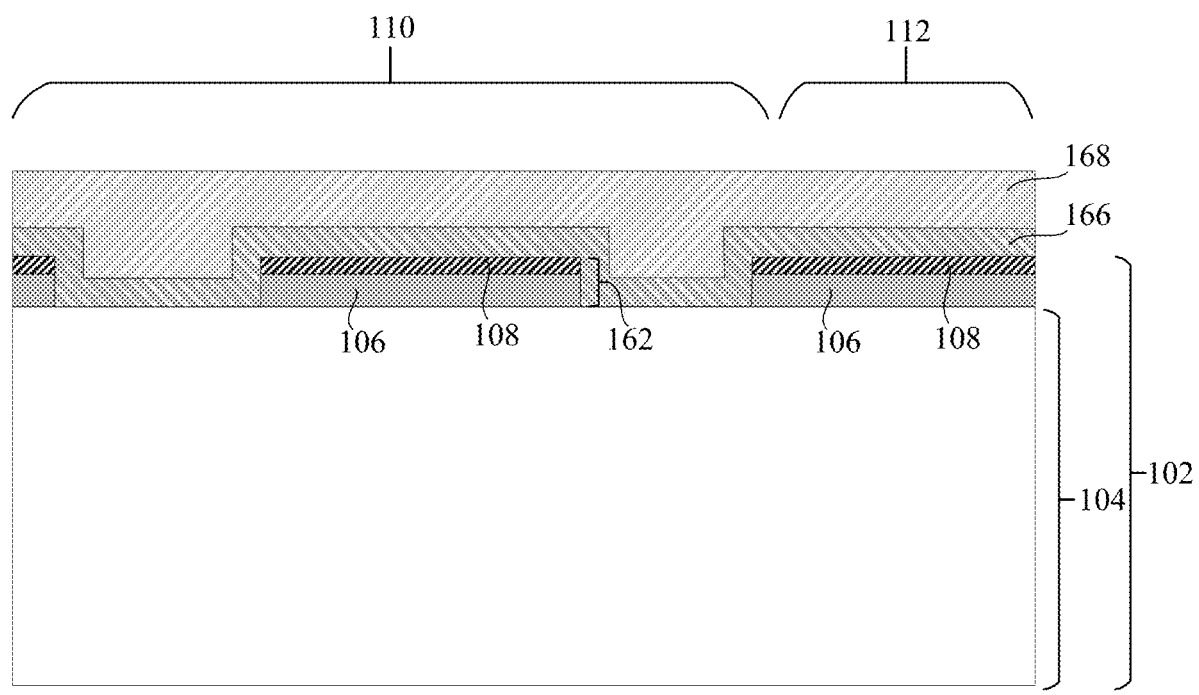
FIG. 4 is a cross-sectional view depicting the formation of a pad oxide layer and a pad nitride layer above the semiconductor layer, in accordance with embodiments of the present disclosure.

FIG. 4 illustrates the formation of a pad oxide layer 166 and a pad nitride layer 168 above the semiconductor layer 108. The pad nitride layer 168 may be deposited on the pad oxide layer 166. The pad oxide layer 166 and the pad nitride layer 168 may be used as mask layers for subsequent patterning steps. Various deposition techniques may be used for the formation step shown in FIG. 4, however, it may be preferable to employ a conformal deposition to form the pad oxide layer 166, such as ALD or a highly-conformal CVD process. Although not shown in the accompanying drawing, it should be understood that a single layer of dielectric material may be used in place of the pad oxide layer 166 and the pad nitride layer 168.

Figure 5A:
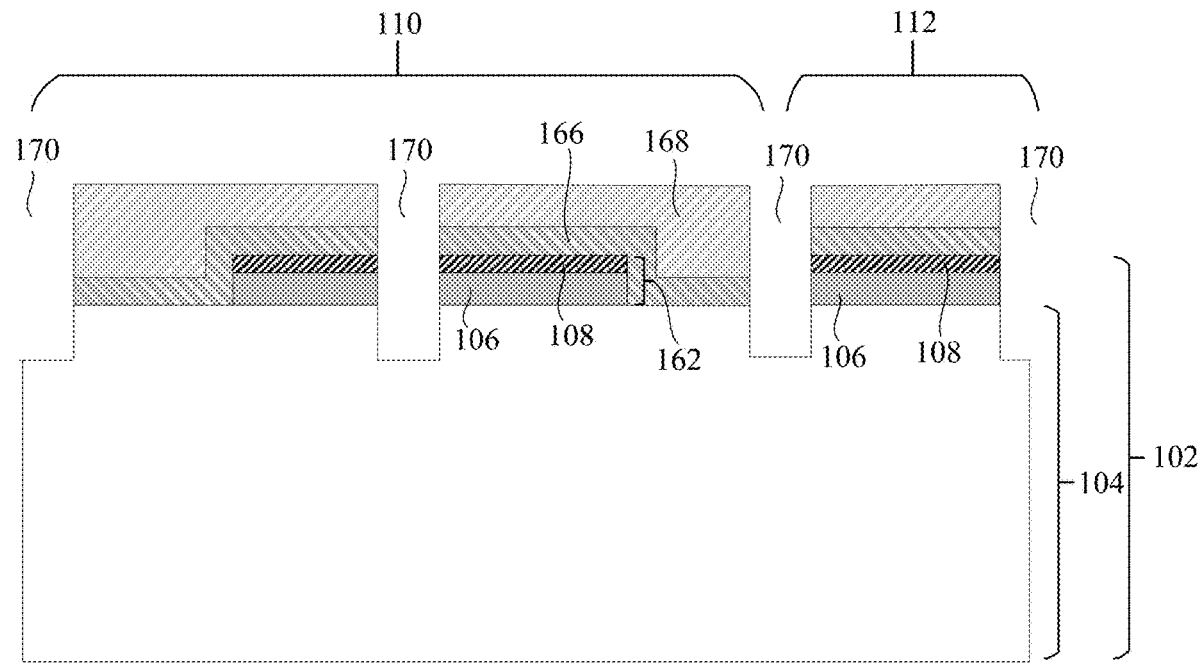
FIGS. 5A and 5B are cross-sectional views depicting examples of forming trenches in the bulk substrate, in accordance with embodiments of the present disclosure.

FIG. 5A illustrates the formation of trenches 170 that extends through the retained portions 162 of the semiconductor layer 108 and the insulating layer 106. As shown, the trenches 170 terminate in the bulk substrate 104. The trenches 170 may be formed by patterning techniques. The pad nitride layer 168, the pad oxide layer 166, the semiconductor layer 108, the insulating layer 106 and the bulk substrate 104 may be etched to form the trenches 170. The etching of the bulk substrate 104 may be controlled such that the trenches 170 have lower portions within the bulk substrate 104.

Figure 5B:
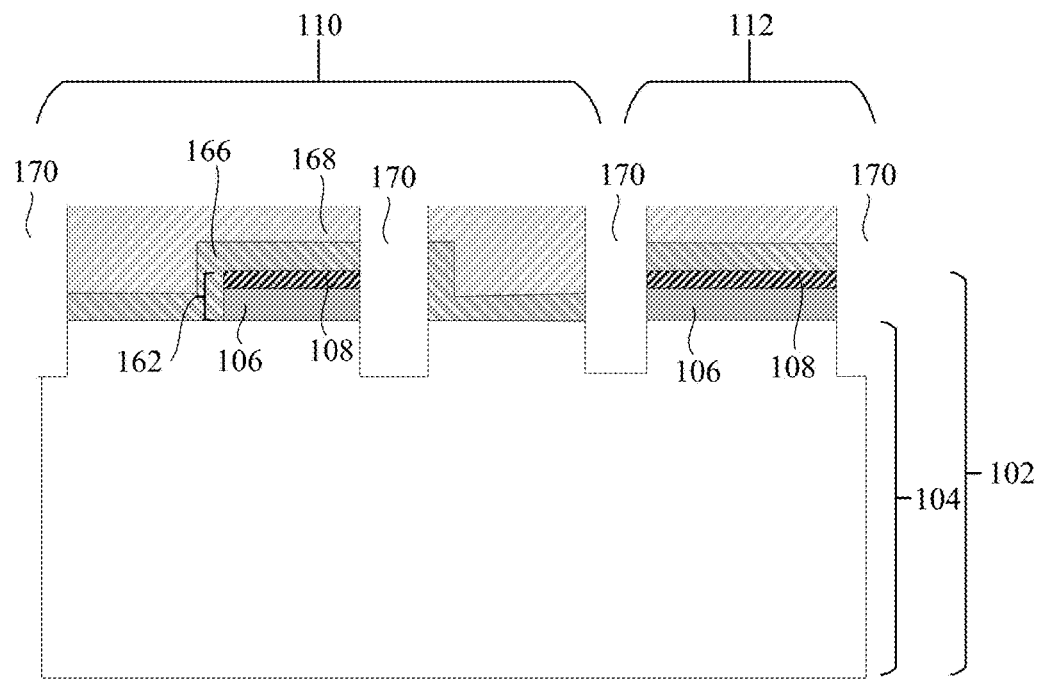

FIG. 5B illustrates another embodiment of the device structure after the formation of the trenches 170. The structure shown in FIG. 5B is similar to the structure shown in FIG. 5A, except that in FIG. 5B, the trench 170 extending through the retained portions 162 of the semiconductor layer 108 and the insulating layer 106 is formed at an edge of the retained portions 162. The structure shown in FIG. 5B may be formed by using similar processing steps described in FIG. 5A.

The embodiment shown in FIG. 5A may be preferably used for subsequent processing to form embodiments of the semiconductor devices having a drain extension region (e.g., the embodiment shown in FIGS. 1A-1C), whereas the embodiment shown in FIG. 5B may be preferably used for subsequent processing to form embodiments of the semiconductor device without a drain extension region. For simplicity, subsequent processing stages continuing from the embodiment of FIG. 5B are not shown, however, it should be understood that these subsequent processing stages are also within the scope of the present disclosure.

Figure 6:
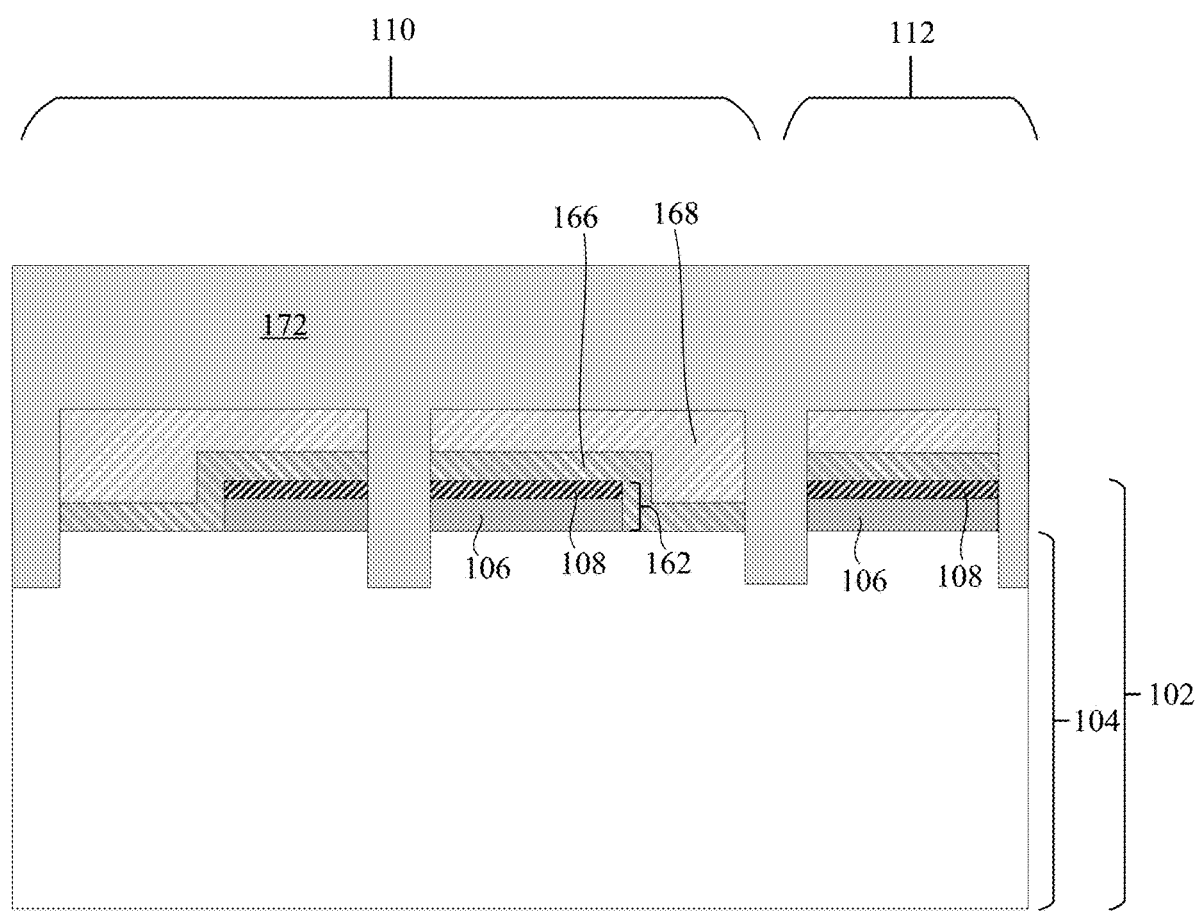
FIGS. 6 to 7 are cross-section views depicting successive stages of forming isolation structures in the bulk substrate, in accordance with embodiments of the present disclosure.

FIG. 6 continues from the embodiment shown in FIG. 5A and illustrates the filling of the trenches 170 with a dielectric material layer 172. The trenches 170 may be filled using deposition techniques described herein. As a non-limiting example, an oxide dielectric material layer 172 may be deposited within the trenches 170 and on the pad nitride layer 168 using CVD. Other deposition techniques and other dielectric materials may also be used to fill the trenches 170.

Figure 7:
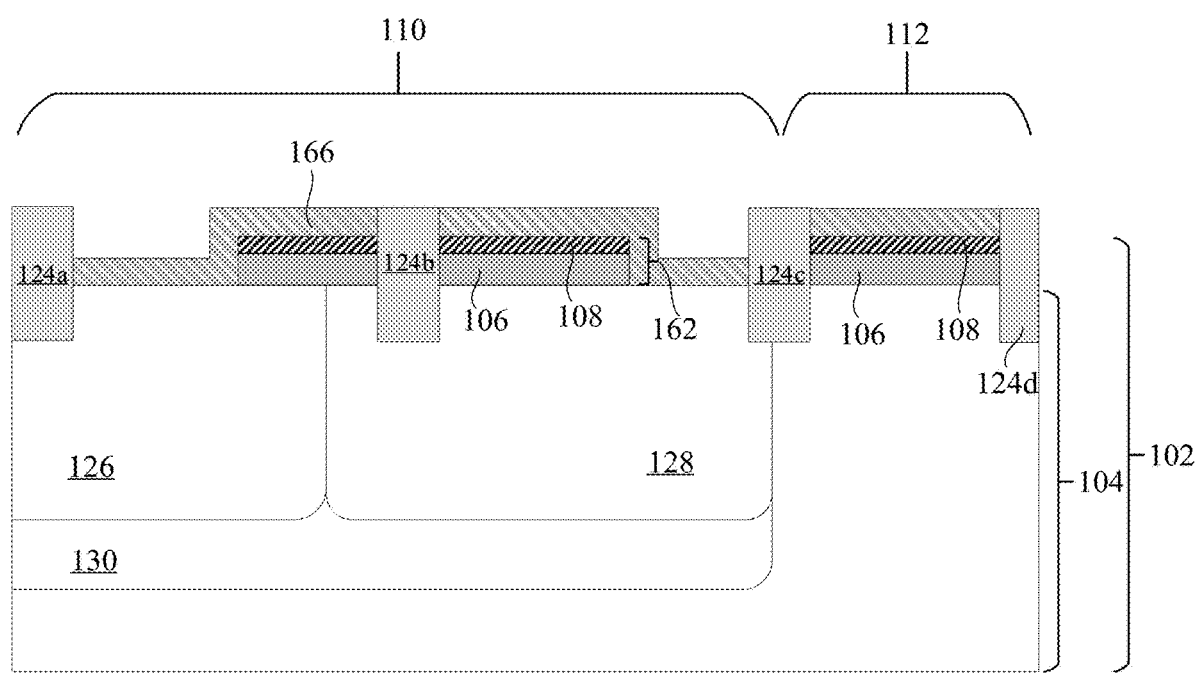

FIG. 7 illustrates the formation of the isolation structures 124a, 124b, 124c, 124d in the bulk substrate 104. In the embodiment shown in FIG. 7, the dielectric material layer 172 is recessed and the pad nitride layer 168 is removed to form the isolation structures 124a, 124b, 124c, 124d. Formation of the isolation structures 124a, 124b, 124c, 124d may include the use of chemical mechanical polishing (CMP), etching and annealing processes. The pad oxide layer 166 may be retained for subsequent doping of the bulk substrate 104.

As described above, the bulk substrate 104 may be doped. The doping process may be performed through the pad oxide layer 166. In the embodiment shown in FIG. 7, the bulk substrate 104 in the first device region 110 is doped to form the body well 126, the drift well 128, and the deep isolation well 130. Various doping techniques such as ion implantation with the use of a mask and a dopant of a conductivity type as described herein may be used. Additional steps of annealing may be performed to control the diffusion of the dopants within the bulk substrate 104.

Figure 8:
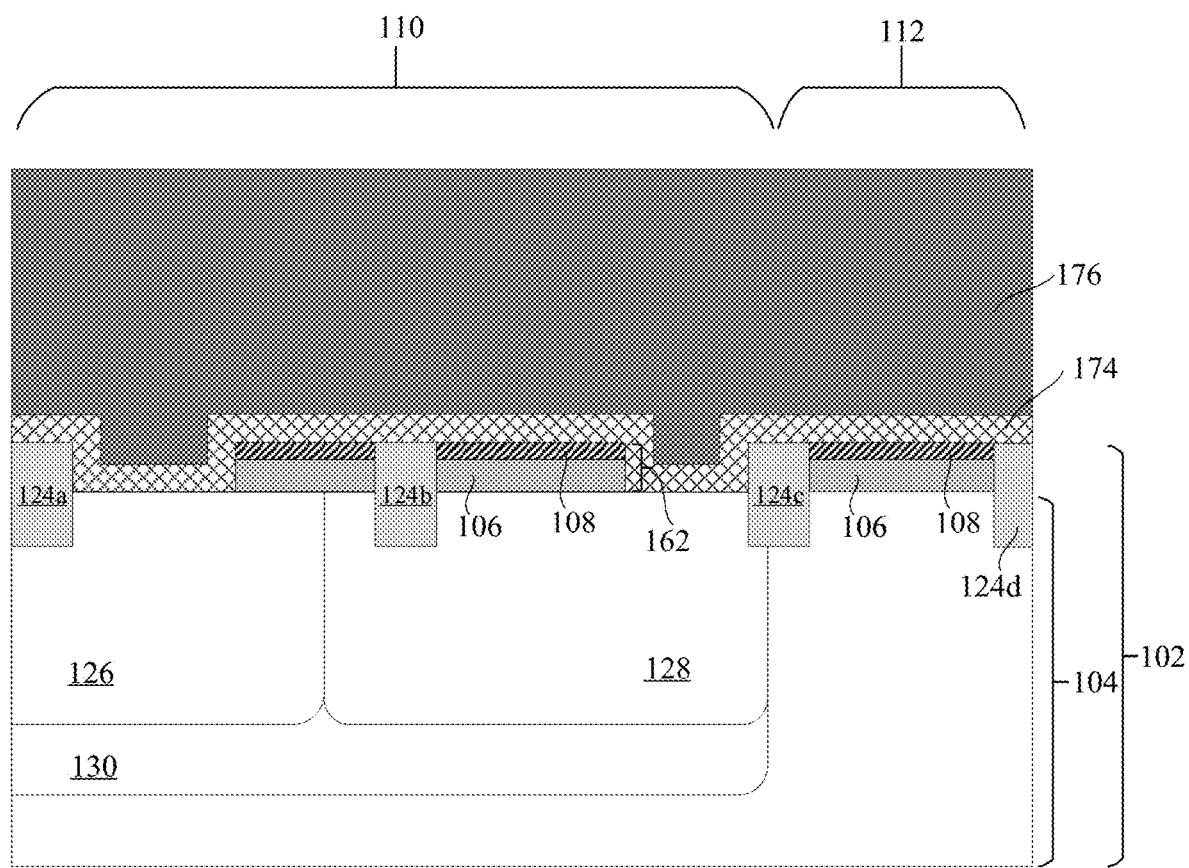
FIG. 8 is a cross-sectional view depicting the formation of a gate electrode layer and a gate stack layer above the semiconductor layer, in accordance with embodiments of the present disclosure.

FIG. 8 illustrates the formation of a gate electrode layer 176 and a gate stack layer 174 above the retained portion of the semiconductor layer 108 in the first device region 110. The pad oxide layer 166 may be removed prior to the formation of the gate stack layer 174, thereby exposing the top surfaces of the bulk substrate 104 and the semiconductor layer 108. The removal of the pad oxide layer 166 may also include recessing the top surfaces of the isolation structures 124a, 124b, 124c, 124d to be co-planar with the top surface of the semiconductor layer 108.

The gate stack layer 174 may be formed by the deposition of several layers, as described in FIG. 2, using deposition techniques. As shown in FIG. 8, the gate stack layer 174 may be deposited on the isolation structures 124a, 124b, 124c, 124d, the top surfaces of the bulk substrate 104, and the retained portions 162 of the semiconductor layer 108 and the insulating layer 106. The gate electrode layer 176 is then deposited on the gate stack layer 174.

Figure 9:
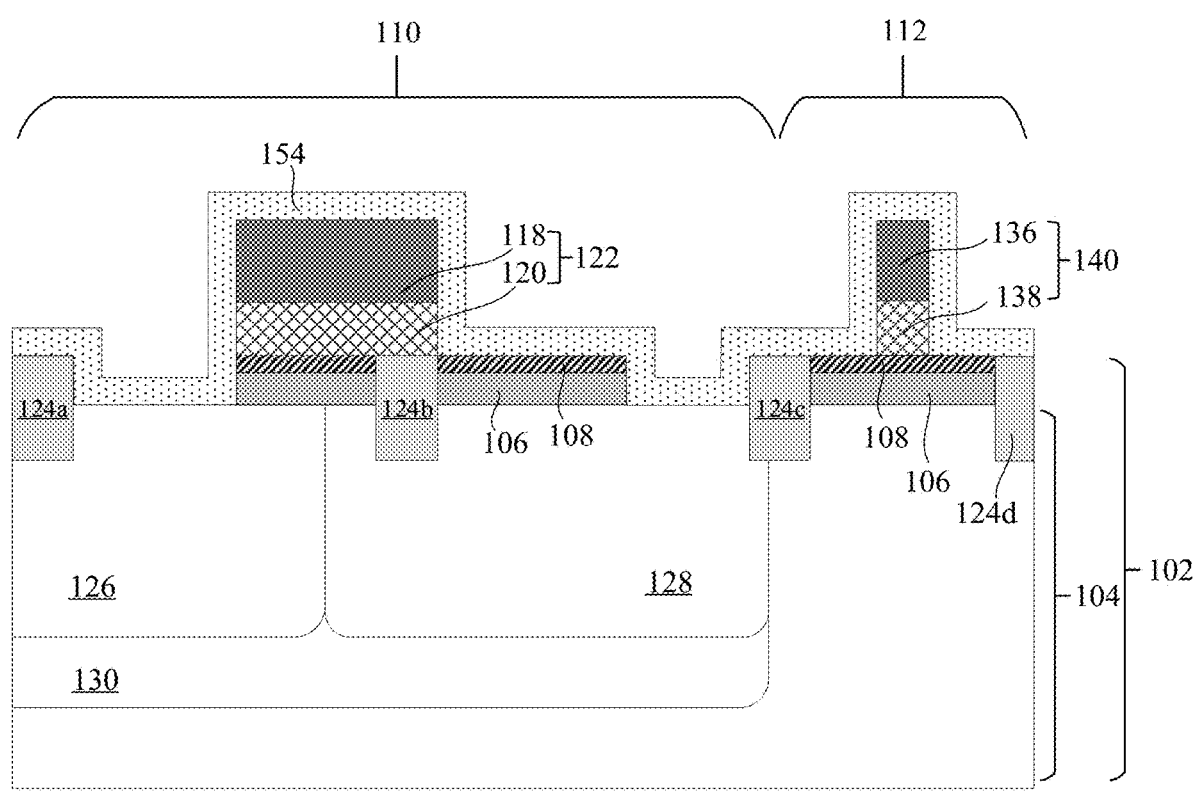
FIGS. 9 to 10 are cross-sectional views depicting an example of forming of gate structures and source and drain regions, in accordance with embodiments of the present disclosure.

FIG. 9 illustrates the formation of a first gate structure 122 in the first device region 110 and a second gate structure 140 in the second device region 112. Formation of the first 122 and second 140 gate structures may be performed by patterning the gate electrode layer 176 and the gate stack layer 174 using patterning techniques.

Thereafter, a spacer layer 154 may be formed on the isolation structures 124a, 124b, 124c, 124d, the bulk substrate 104, the first 122 and second 140 gate structures, and the semiconductor layer 108. The spacer layer 154 may be formed using various deposition techniques; however, it may be preferable to employ a conformal deposition to form the spacer layer 154, such as ALD or a highly-conformal CVD process. The spacer layer 154 may include a dielectric material, such as a nitride-containing compound, silicon nitride, or silicon nitride that is doped or enriched with elements selected from the group consisting of boron, carbon, and oxygen (e.g., SiBCN or SiOCN). Although not shown in the accompanying drawings, a lightly-doped drain (LDD) implantation process may be performed after the formation of the spacer layer 154.

Figure 10:
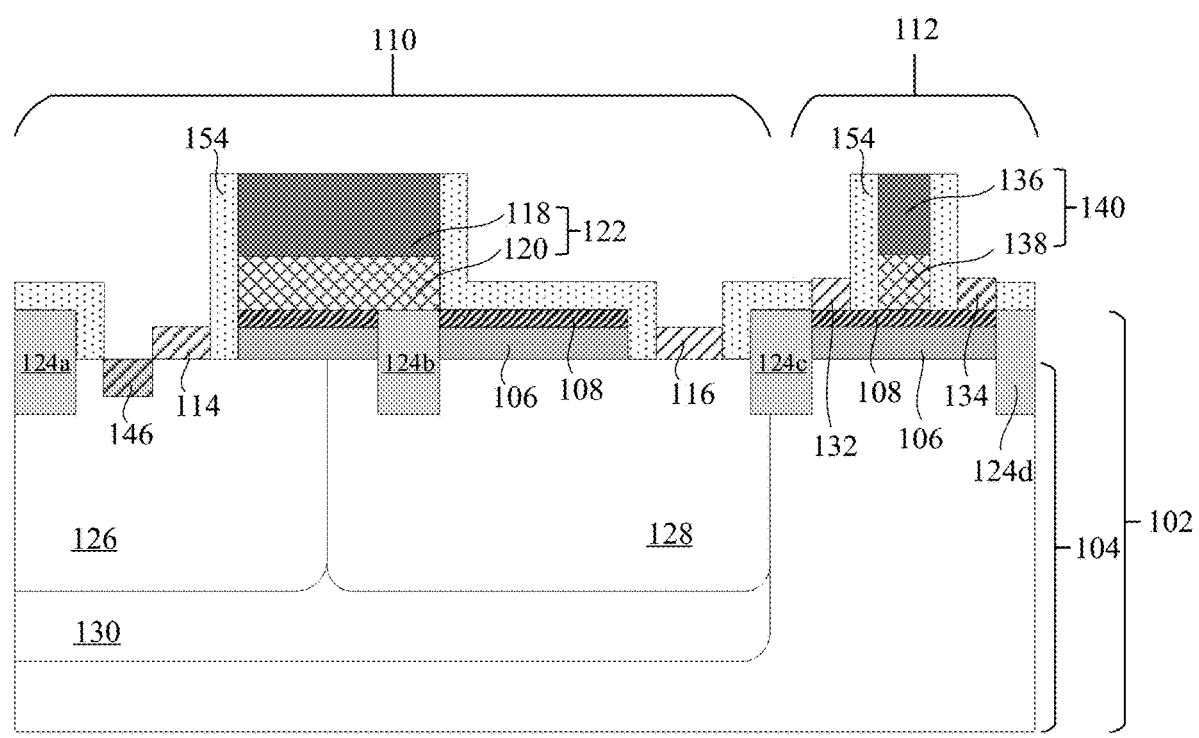

FIG. 10 illustrates the formation of the first source region 114 and the first drain region 116 and the body region 146 in the first device region 110 and the second source region 132 and the second drain region 134 in the second device region 112. The spacer layer 154 may be patterned using patterning techniques to expose top surfaces of the bulk substrate 104 and the semiconductor layer 108 for the formation of the source and drain regions and the body region.

As shown, the first source region 114 and the first drain region 116 are formed on the bulk substrate 104 while the second source region 132 and the second drain region 134 are formed on the semiconductor layer 108. The first source 114 and drain 116 regions and the second source 132 and drain 134 regions may be formed simultaneously using epitaxial growth and in-situ doping. In some embodiments (not shown), the first source 114 and drain 116 regions may be formed by doping the top surface of the bulk substrate 104 in the first device region 110 whereas the second source 132 and drain 134 regions may be raised above the top surface of the semiconductor layer 108 in the second device region 112 using epitaxial growth and in-situ doping.

The body region 146 may be formed in the first device region 110 by doping the top surface of the bulk substrate 104 that is proximally adjacent to the first source region 114. For example, an implantation process may be performed with the use of a photomask or a reticle. The spacer layer 154 may also be patterned to expose top surfaces of the first 122 and second 140 gate structures for subsequent processing.

Subsequent processing of the device structure shown in FIG. 10 may include, but not limited to, silicidation (e.g., forming silicide layers) of the source and drain regions, body region and the top surfaces of the gate structures and the formation of the interconnect structures (e.g., using a damascene process) thereon.

Advantageously, the retaining of the semiconductor layer 108 in the first device region 110 is found to reduce the use of an additional mask or reticle to form a semiconductor device (e.g., a high-voltage device), thereby reducing overall manufacturing cost.

Throughout this disclosure, the terms top, upper, upwards, over, and above refer to the direction away from the substrate. Likewise, the terms bottom, lower, downwards, under, and below refer to the direction towards the bulk substrate. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many processes are only mentioned briefly herein or omitted entirely without providing the well-known process details.

As will be readily apparent to those skilled in the art upon a complete reading of the present application, the disclosed semiconductor devices and methods of forming the same may be employed in manufacturing a variety of different integrated circuit products, including, but not limited to, NV memory devices, CMOS devices, etc.

What is claimed is:

1. A semiconductor device comprising:
 a semiconductor-on-insulator (SOI) substrate comprising a semiconductor layer, a bulk substrate and an insulating layer between the semiconductor layer and the bulk substrate;
 a source region and a drain region disposed directly on the bulk substrate;
 a drift well in the bulk substrate;
 an isolation structure extending through the insulating layer and the semiconductor layer and terminates in the drift well of the bulk substrate; and
 a gate structure between the source region and the drain region, the gate structure is disposed on the semiconductor layer.

2. The device of claim 1, further comprising a body well in the bulk substrate, the body well is adjacent to the drift well.

3. The device of claim 1, wherein the isolation structure has a top surface that is coplanar with a top surface of the semiconductor layer.

4. The device of claim 1, wherein the isolation structure has a top surface that is completely covered by the gate structure.

5. The device of claim 1, wherein the gate structure comprises a gate electrode disposed on a gate stack, the gate stack being disposed on the semiconductor layer.

6. The device of claim 1, wherein the gate structure and the semiconductor layer are of the same material.

7. The device of claim 2, wherein the body well is spaced apart from the drift well by a gap spacing.

8. The device of claim 2, wherein the body well adjoins the drift well.

9. The device of claim 2, wherein the drift well and the drain region are of the same conductivity type.

10. The device of claim 2, wherein the drift well and the body well have opposite conductivity types with respect to each other.

11. The device of claim 2, further comprising a drain extension region in the drift well, the drain extension region being located between the drain region and the gate structure.

12. The device of claim 11, wherein the insulating layer and the semiconductor layer extend laterally to cover the drain extension region.

13. A method of forming a semiconductor device upon a semiconductor-on-insulator (SOI) substrate including a semiconductor layer, a bulk substrate, and an insulating layer disposed between the semiconductor layer and the bulk substrate, the method comprising:
 patterning the insulating layer and the semiconductor layer to expose the bulk substrate and retain portions of the insulating layer and the semiconductor layer above the bulk substrate;
 forming a drift well in the bulk substrate;
 forming an isolation structure extending through the retained portions of the insulating layer and the semiconductor layer and terminating in the drift well of the bulk substrate;
 forming a gate structure on the retained portion of the semiconductor layer; and
 forming a source region and a drain region directly on the exposed bulk substrate, the gate structure being formed between the source region and the drain region.

14. The method of claim 13, wherein the patterning of the insulating layer and the semiconductor layer includes removing portions of the insulating layer and the semiconductor layer to form openings that expose the bulk substrate.

15. The device of claim 8, wherein the body well has an edge and the drift well has an edge, the edge of the body well adjoins the edge of the drift well at a location below the gate structure.

16. The device of claim 2, wherein the gate structure partially overlaps with the drift well and the body well.

17. The device of claim 6, wherein the gate structure has an epitaxial body, and the epitaxial body is of the same material as the semiconductor layer.

18. The device of claim 2, further comprising a body region disposed on the body well.

19. The device of claim 18, further comprising a second isolation structure in the bulk substrate, wherein the source region and the body region are separated by the second isolation structure.

20. The device of claim 2, wherein the drain region is disposed on a top surface of the drift well.

* * * * *